(12) United States Patent
Azadet (10) Patent No.: US 9,760,338 B2
(45) Date of Patent: *Sep. 12, 2017

(54) DIRECT DIGITAL SYNTHESIS OF SIGNALS USING MAXIMUM LIKELIHOOD BIT-STREAM ENCODING

(71) Applicant: Intel Corporation, Santa Clara, CA (US)

(72) Inventor: Kameran Azadet, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/187,651

(22) Filed: Jun. 20, 2016

(65) Prior Publication Data
US 2016/0365950 A1 Dec. 15, 2016

Related U.S. Application Data

(63) Continuation of application No. 13/701,369, filed as application No. PCT/US2012/062175 on Oct. 26, 2012, now Pat. No. 9,372,663.
(Continued)

(51) Int. Cl.
*G06F 5/01* (2006.01)
*G06F 17/15* (2006.01)
(Continued)

(52) U.S. Cl.
CPC .............. *G06F 5/01* (2013.01); *G06F 9/3001* (2013.01); *G06F 9/30036* (2013.01);
(Continued)

(58) Field of Classification Search
CPC ........... H04L 25/0212; H04L 25/03006; H04L 25/03057; H04L 25/03178;
(Continued)

(56) References Cited

U.S. PATENT DOCUMENTS 4,686,688 A * 8/1987 Chung ................... G06F 1/022
332/101
5,031,195 A * 7/1991 Chevillat .......... H04L 25/03044
375/234
(Continued)

FOREIGN PATENT DOCUMENTS

| JP | H11112245 | 4/1999 |
| JP | 2000049613 | 2/2000 |
| JP | 2009531924 | 9/2009 |

OTHER PUBLICATIONS

Final Office Action for U.S. Appl. No. 13/701,369 mailed Oct. 8, 2015, 9 pages.
(Continued)

*Primary Examiner* — Emmanuel Bayard
(74) *Attorney, Agent, or Firm* — Green, Howard & Mughal LLP (57) ABSTRACT

Methods and apparatus are provided for direct synthesis of RF signals using maximum likelihood sequence estimation. An RF digital RF input signal is synthesized by performing maximum likelihood sequence estimation on the digital RF input signal to produce a digital stream, such that after filtering by a prototype filter the produced digital stream produces a substantially minimum error. The substantially minimum error comprises a difference between a digital output of the prototype filter and the digital RF input signal. The digital stream is substantially equal to the input digital RF signal. The digital stream can be applied to an analog restitution filter, and the output of the analog restitution filter comprises an analog RF signal that approximates the digital RF input signal.

19 Claims, 6 Drawing Sheets

Related U.S. Application Data (60) Provisional application No. 61/552,242, filed on Oct. 27, 2011.

(51) Int. Cl.

| | |
|---|---|
| *H03H 17/06* | (2006.01) |
| *H04B 1/04* | (2006.01) |
| *H04L 1/00* | (2006.01) |
| *H04L 27/233* | (2006.01) |
| *H04B 1/62* | (2006.01) |
| *G06F 9/30* | (2006.01) |
| *H04L 25/02* | (2006.01) |
| *H04L 25/03* | (2006.01) |
| *H03M 3/00* | (2006.01) |
| *H03F 1/02* | (2006.01) |
| *H03F 1/32* | (2006.01) |
| *H03F 3/189* | (2006.01) |
| *H03F 3/24* | (2006.01) |
| *H04L 25/49* | (2006.01) |
| *H04B 1/00* | (2006.01) |

(52) U.S. Cl.
CPC ........... *G06F 17/15* (2013.01); *H03F 1/0288* (2013.01); *H03F 1/3241* (2013.01); *H03F 1/3258* (2013.01); *H03F 3/189* (2013.01); *H03F 3/24* (2013.01); *H03H 17/06* (2013.01); *H03M 3/30* (2013.01); *H04B 1/0475* (2013.01); *H04B 1/62* (2013.01); *H04L 1/0054* (2013.01); *H04L 25/02* (2013.01); *H04L 25/03* (2013.01); *H04L 25/03178* (2013.01); *H04L 25/03216* (2013.01); *H04L 25/4917* (2013.01); *H04L 27/2334* (2013.01); *H03F 2200/336* (2013.01); *H03F 2201/3209* (2013.01); *H03F 2201/3212* (2013.01); *H03F 2201/3224* (2013.01); *H03F 2201/3233* (2013.01); *H04B 1/0003* (2013.01); *H04B 2001/0408* (2013.01)

(58) Field of Classification Search
CPC ..... H04L 25/03267; H04L 2025/03605; H04L 2025/03611; H04L 25/0238; H04L 25/025; H04L 2025/0349; H04L 25/0305; H04L 25/0307; H04L 1/0054
USPC .......................... 375/229–233, 341, 265, 350
See application file for complete search history.

(56) References Cited

U.S. PATENT DOCUMENTS

| | | | | |
|---|---|---|---|---|
| 5,550,683 | A * | 8/1996 | Koren | G11B 20/1426 360/46 |
| 5,563,864 | A * | 10/1996 | Kobayashi | G11B 20/10009 369/59.22 |
| 5,646,950 | A * | 7/1997 | Varanasi | H03M 13/00 714/792 |
| 5,706,314 | A | 1/1998 | Davis et al. | |
| 5,949,831 | A | 9/1999 | Coker et al. | |
| 6,124,997 | A * | 9/2000 | Hirasaka | G11B 5/0086 360/53 |
| 6,137,643 | A * | 10/2000 | Flynn | G11B 19/04 360/25 |
| 6,158,027 | A | 12/2000 | Bush et al. | |
| 6,580,768 | B1 | 6/2003 | Jaquette | |
| 6,625,235 | B1 | 9/2003 | Coker et al. | |
| 6,643,814 | B1 | 11/2003 | Cideciyan et al. | |
| 6,690,739 | B1 * | 2/2004 | Mui | H04L 1/0054 375/265 |
| 6,829,299 | B1 * | 12/2004 | Chujoh | H04N 19/70 375/240 |
| 6,850,573 | B1 * | 2/2005 | Noda | G11B 20/10009 375/262 |
| 6,933,865 | B1 * | 8/2005 | Kuznetsov | H03M 5/145 341/59 |
| 6,987,953 | B2 | 1/2006 | Morris et al. | |
| 7,006,017 | B2 * | 2/2006 | Noda | G11B 20/1426 341/58 |
| 7,158,059 | B2 * | 1/2007 | Noda | G11B 20/1426 341/58 |
| 7,193,540 | B2 * | 3/2007 | Noda | G11B 20/1426 341/58 |
| 7,339,500 | B2 * | 3/2008 | Noda | G11B 20/10009 341/50 |
| 7,477,634 | B1 | 1/2009 | McKown | |
| 7,715,731 | B2 * | 5/2010 | Elahmadi | H04B 10/2513 398/188 |
| 7,990,185 | B2 * | 8/2011 | Tran | H03H 15/00 327/552 |
| 2001/0050926 | A1 | 12/2001 | Kumar | |
| 2002/0057735 | A1 | 5/2002 | Piirainen | |
| 2003/0152165 | A1 | 8/2003 | Kondo et al. | |
| 2003/0223505 | A1 | 12/2003 | Verbin et al. | |
| 2004/0160860 | A1 * | 8/2004 | Song | G11B 20/10009 369/13.06 |
| 2004/0205446 | A1 * | 10/2004 | Yamagishi | G11B 20/10009 714/792 |
| 2005/0008070 | A1 * | 1/2005 | Wang | H04B 10/6971 375/232 |
| 2005/0036575 | A1 | 2/2005 | Kuchi et al. | |
| 2005/0281361 | A1 * | 12/2005 | Kim | H04B 7/0669 375/347 |
| 2006/0029149 | A1 | 2/2006 | Kim et al. | |
| 2006/0109938 | A1 | 5/2006 | Challa et al. | |
| 2007/0189402 | A1 | 8/2007 | Yang | |
| 2008/0019422 | A1 | 1/2008 | Smith et al. | |
| 2008/0027720 | A1 | 1/2008 | Kondo et al. | |
| 2008/0316076 | A1 | 12/2008 | Dent et al. | |
| 2009/0116576 | A1 | 5/2009 | Dowling | |
| 2009/0164542 | A1 | 6/2009 | Wu et al. | |
| 2009/0225899 | A1 | 9/2009 | Dent | |
| 2010/0158051 | A1 | 6/2010 | Hadzic et al. | |
| 2010/0273427 | A1 | 10/2010 | Mergen et al. | |
| 2010/0316112 | A1 | 12/2010 | Huang et al. | |
| 2011/0007907 | A1 | 1/2011 | Park et al. | |
| 2011/0019724 | A1 | 1/2011 | Agazzi | |
| 2011/0083058 | A1 * | 4/2011 | Hu | H03M 13/1142 714/758 |
| 2011/0096824 | A1 | 4/2011 | Agazzi et al. | |
| 2012/0087406 | A1 | 4/2012 | Lim et al. | |
| 2012/0106614 | A1 | 5/2012 | Kim et al. | |
| 2012/0188994 | A1 | 7/2012 | Palanki et al. | |
| 2014/0016626 | A1 | 1/2014 | Dai et al. | |
| 2014/0086367 | A1 | 3/2014 | Azadet et al. | |
| 2016/0072647 | A1 * | 3/2016 | Azadet | H04L 1/0054 375/295 |

OTHER PUBLICATIONS

First Office Action & Search Report for Chinese Patent Application No. 201280060981.8 mailed May 25, 2016, 12 pages.

Gopalan et al. "An Optimization Approach to Single-Bit Quantization", IEEE Transactions on Circuits and Systems—I: Regular Papers, vol. 56, No. 12, Dec. 2009, 14 pages.

Non-Final Office Action for Japanese Patent Application No. 2014-539055 mailed Mar. 15, 2016, 4 pages.

Non-Final Office Action for U.S. Appl. No. 13/701,369 mailed Jun. 24, 2014, 13 pages.

Notice of Allowance for U.S. Appl. No. 13/701,369 mailed Feb. 11, 2016, 8 pages.

Notice of Allowance for U.S. Appl. No. 13/701,369 mailed Jan. 21, 2016, 7 pages.

Gopalan, et al., "On an Optimum Algorithm for Waveform Synthesis and its Applications to Digital Transmitters", Wireless Communications and Networking Conferences, 2005 IEEE, Mar. 17, 2005, vol. 2, 6 pages.

(56) References Cited

OTHER PUBLICATIONS

Supplemental Notice of Allowability for U.S. Appl. No. 13/701,369 mailed May 23, 2016, 5 pages.
Supplementary European Search Report and Opinion for European Patent Application No. 12842850.5 mailed Jun. 18, 2015, 4 pages.
Venkataraman et al. "An All-Digital Transmitter with a 1-Bit DAC", IEEE Transactions on Communications, vol. 55, No. 10, Oct. 2007, 12 pages.
Notification of Grant mailed Aug. 23, 2016 for Japanese Patent Application No. 2014-539055.
Notification of Grant mailed Nov. 3, 2016 for Chinese Patent Application No. 201280060981.8.

* cited by examiner

DIRECT DIGITAL SYNTHESIS OF SIGNALS USING MAXIMUM LIKELIHOOD BIT-STREAM ENCODING

CLAIM FOR PRIORITY

This application is a continuation of U.S. patent application Ser. No. 13/701,369, filed on 17 Apr. 2013, titled "DIRECT DIGITAL SYNTHESIS OF SIGNALS USING MAXIMUM LIKELIHOOD BIT-STREAM ENCODING," which claims priority to PCT Patent Application Serial No. PCT/US2012/062175, filed on 26 Oct. 2012, titled "DIRECT DIGITAL SYNTHESIS OF SIGNALS USING MAXIMUM LIKELIHOOD BIT-STREAM ENCODING," which claims priority to U.S. Provisional Patent Application Ser. No. 61/552,242, filed on 27 Oct. 2011, titled "SOFTWARE DIGITAL FRONT END (SOFTDFE) SIGNAL PROCESSING AND DIGITAL RADIO," all of which are incorporated herein by reference in their entirety for all purposes.

FIELD OF THE INVENTION

The present invention is related to bit stream encoding techniques and, more particularly, to techniques for direct synthesis of RF signals using maximum likelihood bit stream encoding.

BACKGROUND OF THE INVENTION

Communication signals are transmitted at a desired frequency obtained by multiplying the original information carrying base band signal by a carrier frequency. In a Radio Frequency (RF) transmitter, for example, the desired RF frequency is typically obtained from the information carrying digital base band signal by converting the digital signal to an analog signal, and then mixing the analog signal with an RF carrier frequency signal using one or more mixers.

A number of direct synthesis techniques have been proposed or suggested for directly synthesizing RF signals from the information carrying digital base band signal. For example, International Patent Application Serial No. PCT/US09/38929, filed Mar. 31, 2009, entitled "Methods and Apparatus for Direct Synthesis of RF Signals Using Delta-Sigma Modulator," discloses techniques for direct synthesis of RF using a delta-sigma modulator.

For high precision digital to analog conversion. when oversampling is possible (e.g., audio or wireless baseband applications where the signal bandwidth is relatively low and oversampling of 10-1000 times is possible), such delta-sigma modulators have been successfully used to achieve high accuracy digital to analog conversion while using a one bit quantizer, a modulator (noise shaper) followed by an filter. The paths of such delta-sigma modulators, are difficult to implement at higher sampling frequencies (e.g., 1 GHz and above). Due to the existence of a non-linear quantizer, the algorithm is difficult to parallelize and hence implement at lower clock frequencies. In addition, the input signal is typically limited to a fraction of the reference voltage, to ensure stability of the modulator (e.g., the technique is not very power efficient). Furthermore, high oversampling ratios (100 or more) are needed for higher resolutions.

A need therefore exists for improved methods and apparatus for direct synthesis of RF signals at higher sampling frequencies. A further need exists for stable modulators for direct synthesis of RF signals where the oversampling ratio is reduced and offers improved noise performance relative to delta-sigma modulators and that can be implemented at higher frequencies (hundreds of megahertz to several gigahertz). For example, GSM signals in many countries are centered around 800 MHz and WCDMA signals are centered around 2.1 GHz (base station transmitter).

SUMMARY OF THE INVENTION

Generally, methods and apparatus are provided for direct synthesis of RF signals using maximum likelihood sequence estimation. According to one aspect of the invention, an RF digital RF input signal is synthesized by performing maximum likelihood sequence estimation on the digital RF input signal to produce a digital stream, such that after filtering by a prototype filter the produced digital stream produces a substantially minimum error. The substantially minimum error comprises a difference between a digital output of the prototype filter and the digital RF input signal. The digital stream is substantially equal to the input digital RF signal. The maximum likelihood sequence estimation comprises, for example, Viterbi decoding, Reduced State Sequence Estimation and/or an M algorithm.

According to another aspect of the invention, the digital stream is applied to an analog restitution filter. An output the analog restitution filter comprises an RF signal that approximates the digital RF input signal. In various embodiments, the analog restitution filter comprises, for example, a passive filter, a resistive-inductive-capacitive (R-L-C) circuit and/or a transmission line.

The prototype filter can have a frequency response that is similar to the restitution filter. In various embodiments, the prototype filter comprises a finite impulse response filter or an infinite impulse response filter. For example, the prototype filter can be a passband filter and the digital RF input signal is a baseband signal modulated to an RF frequency in digital domain. Alternatively, the prototype filter can be a baseband filter and the digital RF input signal is a baseband signal.

A more complete understanding of the present invention, as well as further features and advantages of the present invention, will be obtained by reference to the following detailed description and drawings.

DETAILED DESCRIPTION

Aspects of the present invention provide direct digital sy11m.ests of signals using maximum encoding. According to one aspect of the invention, an encoder is provided based on maximum likelihood encoding Viterbi or M Algorithm). The exemplary maximum likelihood bit-stream encoder produces a substantially optimum sequence of digital stream data (binary ones and zeroes) such that after analog filtering the resulting analog waveform is (nearly) equal to a desired signal. In this manner, a digital signal is approximated by finding a substantially optimum bit (or multi-level) sequence such that after filtering the resulting analog RF signal is nearly equal to the digital version of the input signal.

Delta-Sigma Modulation

Figure 1:
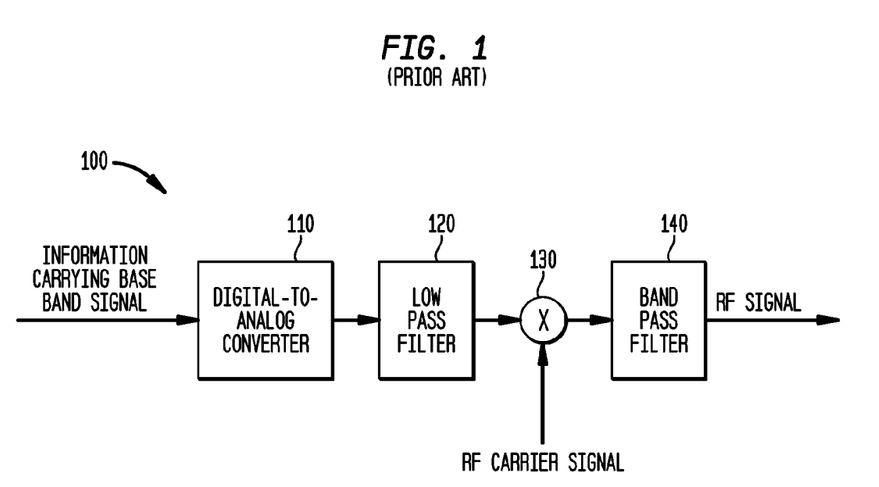
FIG. 1 illustrates a conventional RF transmitter.

FIG. 1 illustrates a conventional RF transmitter 100. As shown in FIG. 1, the conventional RF transmitter 100 initially converts the information carrying base band signal to a digital signal using a digital-to-analog converter 110. The digital signal is then filtered by a low pass filter 120 and mixed with an RF carrier frequency signal using a mixer 130. The output of the mixer 130 is then filtered by a band pass filter 140 to reduce the out-of-band noise, in a known manner.

Figure 2:
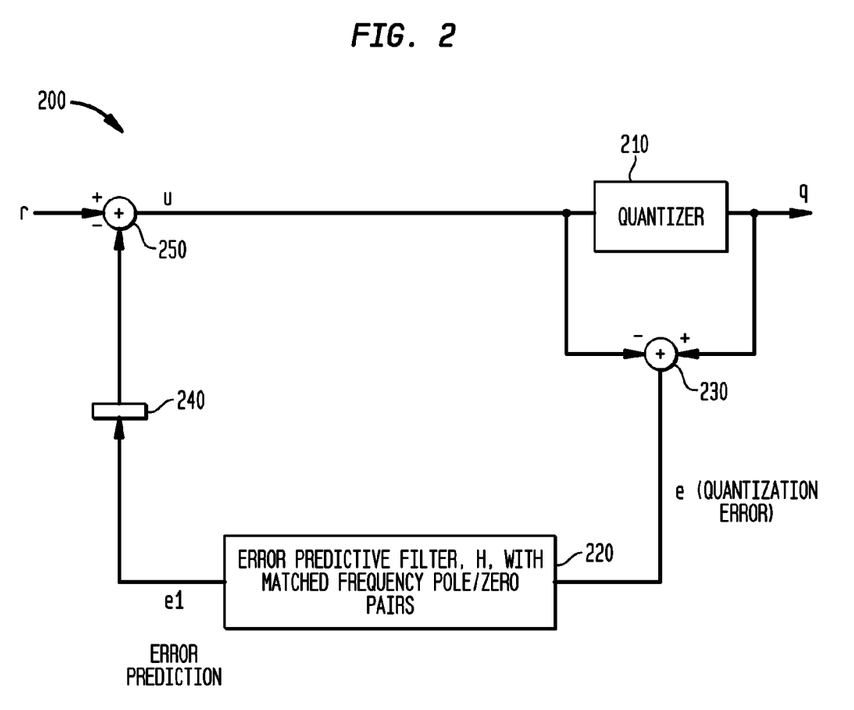
FIG. 2 illustrates an exemplary delta-sigma modulator.

FIG. 2 illustrates an exemplary delta-sigma modulator 200 in accordance with International Patent Application Serial No. PCT/US09/38929, filed Mar. 31, 2009, entitled "Methods and Apparatus for Direct Synthesis of RF Signals Using Delta-Sigma Modulator." As shown in FIG. 2, the exemplary delta-sigma modulator 200 employs a one bit quantizer 210 and an error predictive filter 220 with matched frequency pole/zero pairs. The matched frequency pole/zero pairs are discussed further below in conjunction with Equation (2). The exemplary error predictive filter 220 has an order of 18.

The input value, u, to the one bit quantizer 210 is compared to the quantized output value, q, by an adder 230 that generates a quantization error, e. The quantization en-or, e, is processed by the error predictive filter 220 to generate an error prediction value, e 1, that is stored in a register 240 for one clock cycle and then subtracted from the input signal, r, by an adder 250 that generates the error-compensated input value, u. Generally, error predictive filters 220 employ some knowledge of the input signal to filter the signal, in a known manner. For example, if the error is known to be slowly varying, the error predictive filter 220 can use the same value for subsequent samples.

Generally, the output of the one bit quantizer 210 provides a coarse approximation of the input signal. The input signal, r, may be, for a 16 bit digital value, and the one bit quantization performed by the quantizer 210 the quantization can be based on the polarity of the input signal) for a coarse analog conversion. The quantization noise, e, associated with the one bit quantizer 210 is primarily out-of-band. As previously indicated, the one bit quantization performed by the quantizer 210 is inherently linear.

In the exemplary embodiment described herein, the quantization error, e(n), is assumed to be uncorrelated to the input, r(n). Thus, the power spectral density, $S_{q,q}$, of the quantizer output, q(t), can be expressed a function of the frequency, f, as follows:

$$S_{q,q}(f) = S_{r,r}(f) + (1-H(z))^2 S_{e,e}(f) \quad (1)$$

Where r is the input signal and $$z = e^{2j\pi \frac{f}{Fs}}.$$

The error predictive filter 220 provides zeroes at desired frequencies of $f_1, f_2, \ldots f_N$, and provides poles at substantially the same frequencies as the zeroes, with the poles having magnitude values, $\alpha_i$, less than one. It is noted that the placement of the poles and zeros may be fixed or variable and may be optimized for a given implementation, as would be apparent to a person of ordinary skill in the art.

Figure 3:
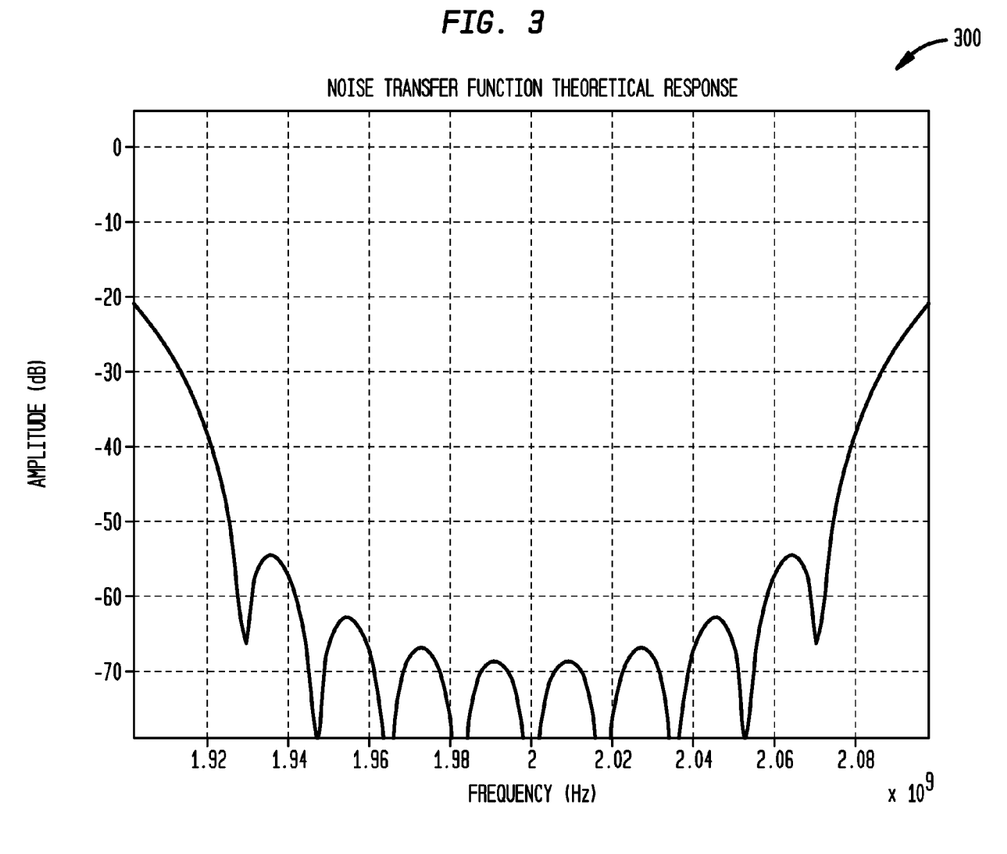
FIG. 3 illustrates a frequency response for an exemplary one bit delta-sigma modulator.

FIG. 3 illustrates a frequency response 300 for an exemplary passband delta-sigma modulator 200 having an order of 18. As shown in FIG. 3, the exemplary error predictive filter 220 exhibits a passband around 2 GHz and has a bandwidth of 100 MHz. Significantly, the exemplary error predictive filter 220 demonstrates an SFDR of 110 dB.

Direct Synthesis Using Maximum Likelihood Bit-Stream Encoding

Figure 4:
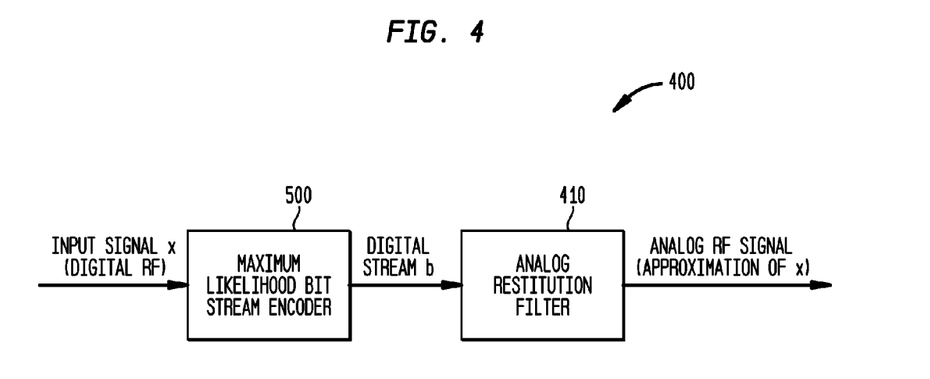
FIG. 4 is a schematic block diagram of an exemplary maximum likelihood bit-stream encoding system incorporating aspects of the present invention.

FIG. 4 is a schematic block diagram of an exemplary maximum likelihood bit-stream encoding system 400 incorporating aspects of the present invention. As shown in FIG. 4, the maximum likelihood bit-stream encoding system 400 comprises a maximum likelihood bit-stream encoder 500, discussed further below in conjunction with FIG. 5, and an analog restitution filter 410. An input signal x is applied to the maximum likelihood bit-stream encoder 500. The input signal x comprises a digital RF signal.

As discussed further below in conjunction with FIG. 5, the maximum likelihood bit-stream encoder 500 produces a digital stream b that is substantially equal to the digital RF input signal x such that after filtering by a prototype filter the produced digital stream b produces a substantially minimum error. As discussed below, the error is defined as a difference between the digital output of the prototype filter and the digital RF input signal x.

The digital stream b can be, for example, a two-level binary signal, a multi-level signal, as well as one or more of NRZ, PAM, QAM (e.g., QPSK) signals.

As shown in FIG. 4, the digital stream b is applied to an analog restitution filter 410 to generate an analog RF signal that approximates the digital RF input signal x. The analog restitution filter 410 is typically passive and may be embodied, for example, using resistive-inductive-capacitive (R-L-C) circuits and/or transmission lines.

Aspects of the present invention recognize that maximum likelihood sequence estimation (MLSE) techniques can be applied to data conversion and encoding, and not just the more typical data decoding.

Figure 5:
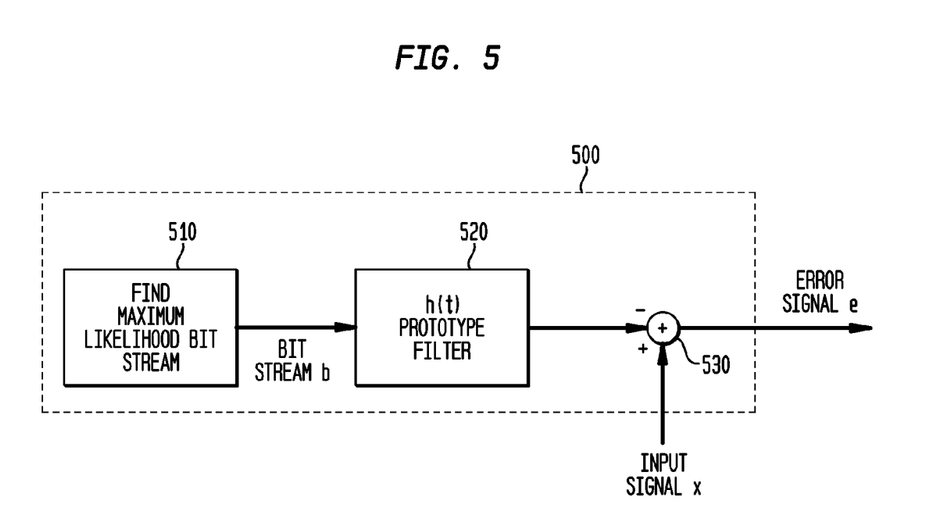
FIG. 5 is a schematic block diagram of an exemplary implementation of the maximum likelihood bit-stream encoder of FIG. 4.

FIG. 5 is a schematic block diagram of an exemplary maximum likelihood bit-stream encoder 500 incorporating aspects of the present invention. As shown in FIG. 5, the maximum likelihood bit-stream encoder 500 receives a digital RF input signal x and produces a digital stream b that is substantially equal to the digital RF input signal x such that after filtering by a h(t) prototype filter 520, discussed further below in conjunction with FIG. 6, the produced digital stream b produces a substantially minimum error e. As shown in FIG. 5, the exemplary error signal e is obtained by an adder 530 as a difference between the digital output of the prototype filter 520 (filtered digital bit-stream b) and the digital RF input signal x.

Generally, the h(t) prototype filter 520 has a passband that is substantially centered around the frequency of the digital input signal x. The h(t) prototype filter 520 can be implemented, for example, as a finite impulse response (FIR) or an infinite impulse response (IIR) filter.

At stage 510, the maximum likelihood bit-stream encoder 500 finds the maximum likelihood bit stream (bit stream b) that minimizes the error e using maximum likelihood sequence estimation (MLSE) techniques. The MSLE techniques comprise, for example, one or more of a Viterbi algorithm, Reduced State Sequence Estimation (RSSE) and an M algorithm (to reduce number of states of the decoder which can large). If the number of taps is Ntaps, the number states of the decoder is $2^{Ntaps}$ grows exponentially with number of taps and may not be practical. For a discussion of the M algorithm, see, for example, E. F. Haratsch, "High-Speed VLSI Implementation of Reduced Complexity Sequence Estimation Algorithms with Application to Gigabit Ethernet 1000 BaseT," Int'l Symposium on VLSI Technology, Systems, and Applications, Taipei (June 1999), each incorporated by reference herein.

The analog restitution filter 410 is designed based on the characteristics of the input signal x and the prototype filter 520 has a frequency response that is similar to the restitution filter 410.

The MLSE optionally incorporates in its decoding the non-linear memory of an RF power amplifier (Class S switching-type amplifier) or digital driver analog circuit (e.g., the transmit circuit of a serializer-deserializer (SerDes) commonly used in digital or mixed signal System on a Chip (SOC)) to compensate for the non-linearity of these devices. The System on a Chip may comprise, for example, a baseband signal processor, a digital front end (DFE) or a single chip base station.

Figure 6A:
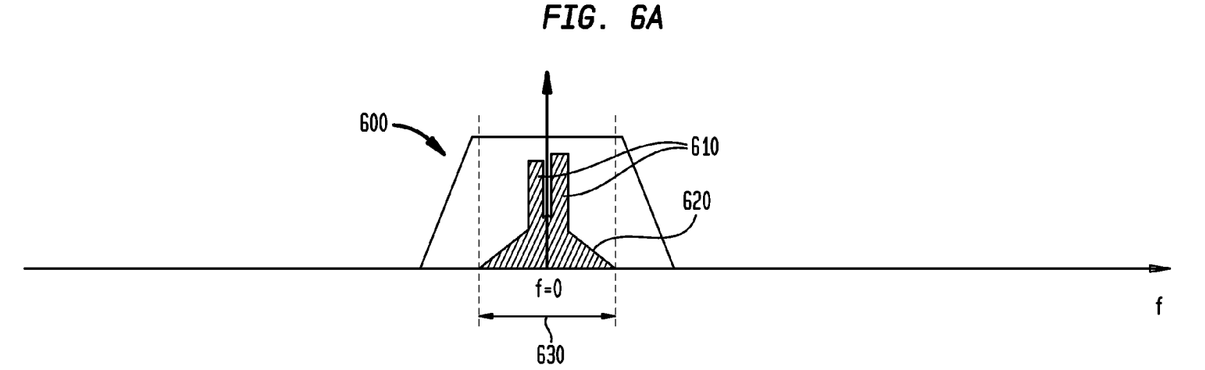
FIGS. 6A and 6B illustrate exemplary filter responses for the h(t) prototype filter for a baseband and passband implementation, respectively.
Figure 6B:
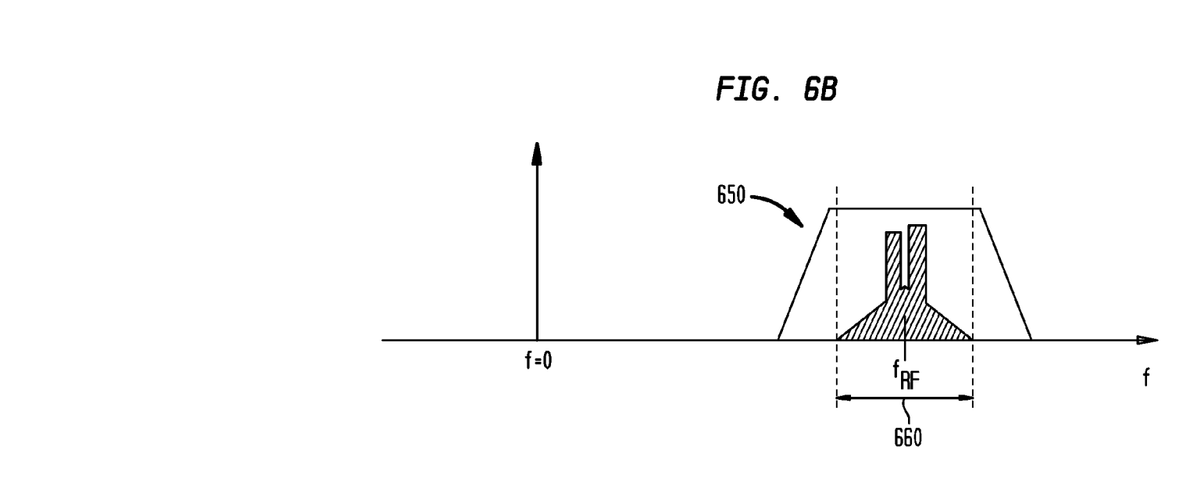

FIGS. 6A and 6B illustrate exemplary filter responses for the h(t) prototype filter 620 for a baseband and passband implementation, respectively. As shown in FIG. 6A, the h(t) baseband prototype filter 620 has a baseband response 610 (2 carriers of 20 MHz LTE), such as, e.g., a 40 MHz LTE baseband signal. The exemplary corresponding sampling rate is 5.89824 GSPS (=30.62 MSPS (LTE baseband)). The response portion 620 is attributable to spectral re-growth due to digital pre-distortion (DPD). The signal bandwidth of interest 630 is, e.g., 120 MHz after DPD up to 3rd order correction (or 200 MHz for $5^{th}$ order correction).

As shown in FIG. 6B, the h(t) passband prototype filter 620 has a passband response 650 and a signal bandwidth of interest 660. In the passband case, a too small signal bandwidth is difficult to realize as it results in a very high Q filter (e.g., 2.14 GHz/20 MHz Q-100 (too high), however 2.14 GHz/200 MHz results in Q of 10 which is practical).

In a further variation, a maximum likelihood encoder can also be used as an analog to digital converter, where the input signal is an analog signal instead of a digital signal, the prototype filter is analog, the restitution filter is digital and the maximum likelihood decoder is implemented in the analog domain.

CONCLUSION

While exemplary embodiments of the invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit or micro-controller. Such hardware and software may be embodied within circuits implemented within an integrated circuit.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, wherein, when the program code is loaded into and executed by a machine, such as a processor, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

What is claimed is:

1. An apparatus comprising:
    an encoder to implement maximum likelihood encoding, wherein the encoder is to receive a digital radio frequency (RF) signal; and
    an analog filter coupled to the encoder, wherein the analog filter is to filter an encoded version of the digital RF signal, and wherein the analog filter is to provide an analog RF signal.

2. The apparatus of claim 1, wherein the encoder comprises: circuitry to find a maximum likelihood bit-stream from the digital RF signal.

3. The apparatus of claim 2, wherein the circuitry is to generate a multi-level signal.

4. The apparatus of claim 3, wherein the multi-level signal is one of: binary signal, NRZ signal, PAM signal, or QAM signal.

5. The apparatus of claim 2, wherein the encoder comprises a prototype filter coupled to the circuitry.

6. The apparatus of claim 5, wherein the encoder comprises an adder coupled to the prototype filter.

7. The apparatus of claim 6, wherein the adder is to receive an output of the prototype filter and another digital signal, and wherein the adder is to provide an error signal which is to be received by the analog filter.

8. The apparatus of claim 7, wherein the prototype filter has a passband which is centered around a frequency of the other digital signal.

9. The apparatus of claim 7, wherein the adder is to determine a difference between the output of the prototype filter and the other digital signal.

10. The apparatus of claim 5, wherein the prototype filter is one of finite impulse response (FIR) filter or an infinite impulse response (IIR) filter.

11. The apparatus of claim 1, wherein the analog filter is an analog restitution filter.

12. The apparatus of claim 11, wherein the analog restitution filter comprises passive devices.

13. The apparatus of claim 1, wherein the maximum likelihood encoding is implemented as one of: Viterbi, reduced state sequence estimation, or M Algorithm.

14. A system comprising:
    an RF power amplifier having non-linear memory;
    a baseband signal processor;
    a digital front end;
    an encoder coupled to the RF power amplifier, wherein the encoder is to implement maximum likelihood encoding, and wherein the encoder is to receive a digital radio frequency (RF) signal; and
    an analog filter coupled to the encoder, wherein the analog filter is to filter an encoded version of the digital RF signal, and is to provide an analog RF signal.

15. The system of claim 14, wherein the RF power amplifier is a Class S switching-type amplifier.

16. The system of claim 14, wherein encoder comprises:
    circuitry to find a maximum likelihood bit-stream from the digital RF signal;
    a prototype filter coupled to the circuitry; and
    an adder coupled to the prototype filter.

17. An apparatus comprising:
   an encoder to implement maximum likelihood encoding, wherein the encoder is to receive an analog signal; and
   a digital filter coupled to the encoder, wherein the digital filter is to filter an encoded version of the analog signal, and is to provide a digital signal which corresponds to the analog signal.

18. The apparatus of claim 17, wherein the encoder and the digital filter are part of an analog-to-digital converter (ADC).

19. The apparatus of claim 17, wherein the maximum likelihood encoding is implemented as one of: Viterbi, reduced state sequence estimation, or M Algorithm.

* * * * *